(12) United States Patent
Jeon et al.

(10) Patent No.: US 7,940,349 B2
(45) Date of Patent: May 10, 2011

(54) LIGHT SOURCE DEVICE AND LIQUID CRYSTAL DISPLAY DEVICE HAVING THE SAME

(75) Inventors: Eun-Chae Jeon, Seoul (KR); Se-Ki Park, Suwon-si (KR); Eun-Jeong Kang, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 11/933,363

(22) Filed: Oct. 31, 2007

(65) Prior Publication Data

US 2008/0100774 A1 May 1, 2008

(30) Foreign Application Priority Data

Oct. 31, 2006 (KR) .................. 10-2006-0106376

(51) Int. Cl.
*G02F 1/335* (2006.01)
*F21V 5/04* (2006.01)

(52) U.S. Cl. ............... 349/62; 362/246.02; 362/311.02
(58) Field of Classification Search ............... 349/62; 362/249.02, 311.02
See application file for complete search history.

(56) References Cited

U.S. PATENT DOCUMENTS

| 6,034,712 A * | 3/2000 | Iwasaki ................. 347/241 |
| 2003/0072153 A1* | 4/2003 | Matsui et al. .......... 362/231 |
| 2007/0085944 A1* | 4/2007 | Tanaka et al. .......... 349/69 |

* cited by examiner

*Primary Examiner* — Jerry T Rahll
(74) *Attorney, Agent, or Firm* — H.C. Park & Associates, PLC

(57) ABSTRACT

A light source device, including a substrate, a plurality of light emitting diode chips mounted on the substrate, and an encapsulant covering the plurality of light emitting diode chips. The encapsulant has a plurality of lenses connected to each other and each lens corresponds to one of the plurality of light emitting diode chips.

19 Claims, 21 Drawing Sheets

LIGHT SOURCE DEVICE AND LIQUID CRYSTAL DISPLAY DEVICE HAVING THE SAME

CROSS-REFERENCE TO RELATED APPLICATIONS

This application claims priority from and the benefit of Korean Patent Application No. 10-2006-0106376, filed on Oct. 31, 2006, which is hereby incorporated by reference for all purposes as if fully set forth herein.

BACKGROUND OF THE INVENTION

1. Field of the Invention

The present invention relates to a light source device and a liquid crystal display (LCD) device including the light source device.

2. Discussion of the Background

A liquid crystal display (LCD) device includes a liquid crystal display panel and a backlight unit. The liquid crystal display panel includes a thin film transistor (TFT) substrate, a counter substrate, and a liquid crystal layer disposed between the TFT substrate and the counter substrate. As the LCD panel does not emit light itself, it receives light from a backlight unit that is disposed behind the TFT substrate. The light transmittance of the backlight unit may be adjusted according to the arrangement of liquid crystals.

A point light source, such as a light emitting diode, has become a more popular light source for a backlight unit than a line light source, such as a lamp.

The light emitting diode may be a chip on board (COB) type in which a light emitting diode chip is mounted in a substrate. The mounted light emitting diode chip is encapsulated by an encapsulant, which includes resin or silicon, to adjust the emission angle. The encapsulant protects the light emitting diode chip.

As the COB type of light emitting diode does not require a packaging process, production costs may be reduced as compared to a package type in which the light emitting diode chip must be packaged and mounted in a substrate.

If the backlight unit employs a light emitting diode, a plurality of light emitting diodes may be used to emit different colors of light. The light from the light emitting diodes may be mixed and may become white light to be supplied to the LCD panel.

However, if the different colors of light are not sufficiently mixed, color shading occurs in the LCD device and light uniformity is very low. Also, as light efficiency decreases, the brightness of light supplied to the LCD device becomes unsatisfactory.

SUMMARY OF THE INVENTION

The present invention provides a light source device that may provide high color mixing efficiency and light efficiency.

The present invention also provides a liquid crystal display (LCD) device that has a light source device that may have high color mixing efficiency and light efficiency.

Additional features of the present invention will be set forth in the description which follows, and in part will be apparent from the description, or may be learned by practice of the present invention.

The present invention discloses a light source device including a substrate, a plurality of light emitting diode chips mounted on the substrate, and an encapsulant covering the plurality of light emitting diode chips. The encapsulant has a plurality of lenses connected to each other and each lens corresponds to one of the plurality of light emitting diode chips.

The present invention also discloses a light source device including a substrate, a plurality of light emitting diode chips which are mounted on the substrate, and an encapsulant covering the plurality of light emitting diode chips. The height of the encapsulant is greater in portions of the encapsulant corresponding to the respective light emitting diode chips than in a center of the encapsulant.

The present invention also discloses a liquid crystal display device including a liquid crystal display panel and a light source part disposed behind the liquid crystal display panel. The light source part includes a substrate, a plurality of light emitting diode chips mounted on the substrate, and an encapsulant covering the plurality of light emitting diode chips. The encapsulant has a plurality of lenses connected to each other and each lens corresponds to one of the plurality of light emitting diode chips.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF ILLUSTRATED EMBODIMENTS

Figure 1:
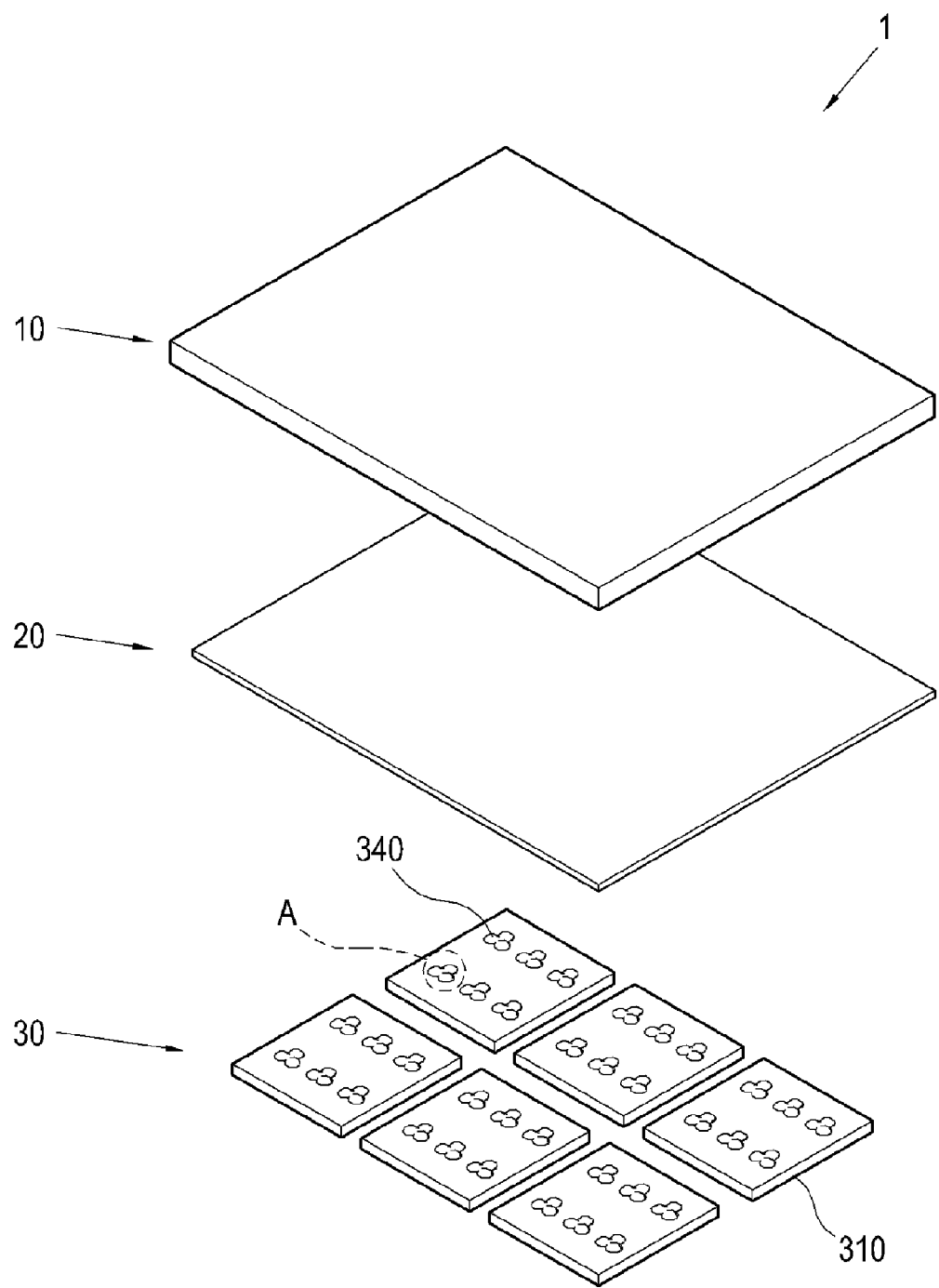
FIG. 1 is an exploded perspective view of an LCD device according to a first exemplary embodiment of the present invention.

The invention is described more fully hereinafter with referenced to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

A liquid crystal display (LCD) device according to a first exemplary embodiment of the present invention will be described with reference to FIG. 1, FIG. 2, FIG. 3, FIG. 4, and FIG. 5.

As shown in FIG. 1, an LCD device 1 includes an LCD panel 10, a light adjusting member 20 disposed behind the LCD panel 10, and a light source device 30 disposed behind the light adjusting member 20.

The light adjusting member 20 may include a diffusion plate, a diffusion film, a prism film, a reflective polarizing film, or a protection film.

The light source device 30 includes six substrates 310. The substrates 310 are arranged in a 2×3 matrix pattern behind the LCD panel 10. Each substrate 310 includes six encapsulants 340. The encapsulants 340 are arranged in 2×3 matrix patterns on the respective substrates 310.

The LCD device 1 may further include a reflection sheet (not shown) that covers the surfaces of the substrates 310. A through hole may be formed in the reflection sheet to expose the respective encapsulants 340 there through.

Figure 2:
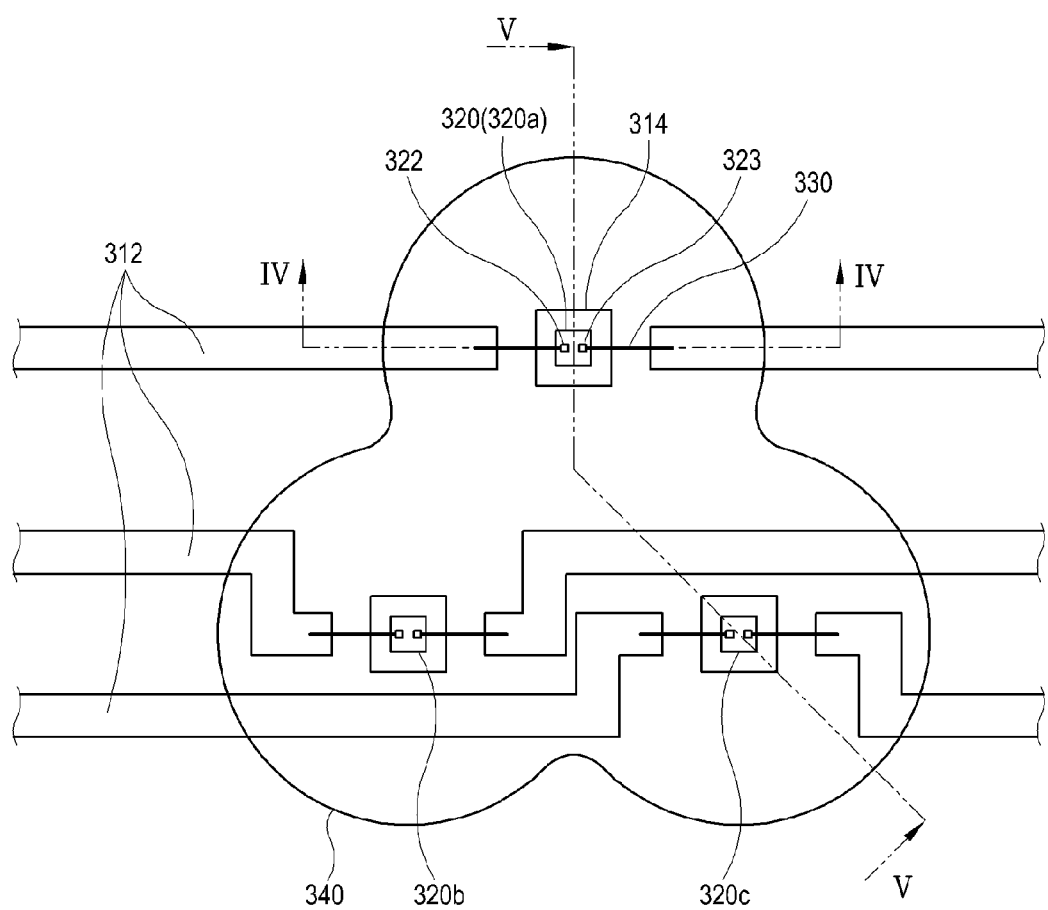
FIG. 2 is an enlarged perspective view of a part "A" in FIG. 2.
Figure 3:
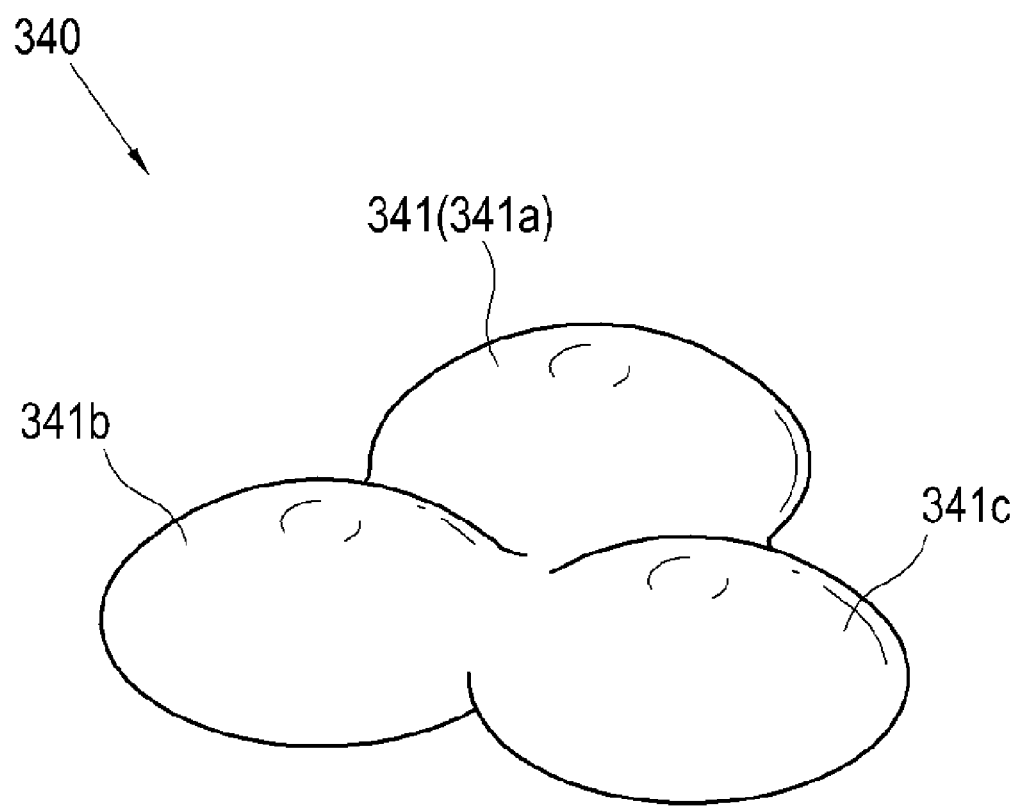
FIG. 3 is a perspective view of an encapsulant of the LCD device according to the first exemplary embodiment of the present invention.
Figure 4:
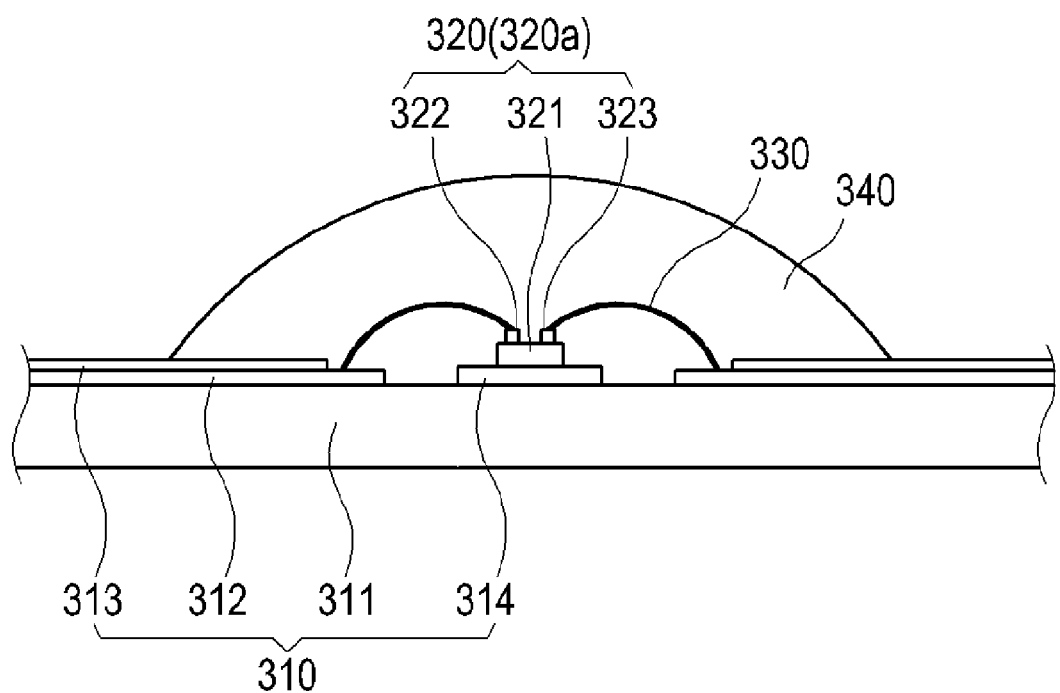
FIG. 4 is a cross-sectional view of the encapsulant of the LCD device taken along line IV-IV in FIG. 2.

Referring to FIG. 2, FIG. 3, and FIG. 4, the light source device 30 includes the substrates 310, a light emitting diode chip 320 disposed on the substrates 310, a wire 330 connecting a power supply wire 312 on the substrates 310 and the light emitting diode chip 320 and the encapsulants 340 that encapsulate the light emitting diode chip 320.

The substrates 310 include a substrate main body 311, a power supply wire 312 formed in one surface of the substrate main body 311, an insulating layer 313 covering the power supply wire 312, and a chip seating part 314 disposed between the power supply lines 312 with the light emitting diode chip 320.

The substrate main body 311 may include aluminum having high heat conductivity to transfer heat from the light emitting diode chip 320 to the outside.

The power supply wire 312 may include copper and aluminum which have high electrical conductivity. Most of the power supply wire 312 is covered with the insulating layer 313 while a part thereof is exposed to allow for connection with the light emitting diode chip 320.

The chip seating part 314 is disposed between the exposed power supply wires 312. The chip seating part 314 may include copper, etc. The light emitting diode chip 320 is mounted in the substrates 310 through soldering. Here, the chip seating part 314 simplifies the process of soldering the light emitting diode chip 320. The chip seating part 314 and the power supply wires 312 may include the same material(s).

Each encapsulant 340 encapsulates three light emitting diode chips 320. The three light emitting diode chips 320 are arranged in a triangular shape. The light emitting diode chips 320 include a first light emitting diode chip 320a that emits a red light, a second light emitting diode chip 320b that emits a green light, and a third light emitting diode chip 320c that emits a blue light.

The respective light emitting diode chips 320 include a chip main body 321 and a pair of chip electrodes 322 and 323 disposed on the chip main body 321. The chip electrodes 322 and 323 are connected with different power supply wires 312. One of the chip electrodes 322 and 323 receives an electron from the power supply wires 312 while the other chip electrode 322 and 323 receives a hole from the power supply wires 312. The electron and the hole are combined in the chip main body 321 to emit light.

The chip electrodes 322 and 323 and the power supply wires 312 are connected to each other by the wires 330. The wires 330 are used for wire bondings between the chip electrodes 322 or 323 and the power supply wires 312.

In the wire bonding method of producing semiconductors, a semiconductor element is connected to other elements with a thin wire. The chip electrodes 322 and 323 and the power supply wires 312 may be wire-bonded using electrical discharge, ultrasound waves, or a laser.

The encapsulants 340 encapsulate the light emitting diode chips 320 and the wire 330. Even though the light emitting diode chips 320 may be driven without the encapsulants 340, the light emitting diode chips 320 and the wire 330 can be damaged easily by the external environment. The encapsulants 340 protect the light emitting diode chips 320 and the wire 330 from the external environment.

As light from the light emitting diode chips 320 is emitted in all directions, light efficiency and color mixing efficiency decrease. The encapsulants 340 adjust the distribution of emitting light from the light emitting diode chips 320 to improve light efficiency and color mixing efficiency.

The encapsulants 340 may include a silicon compound, epoxy resin, or acrylic resin.

Figure 5:
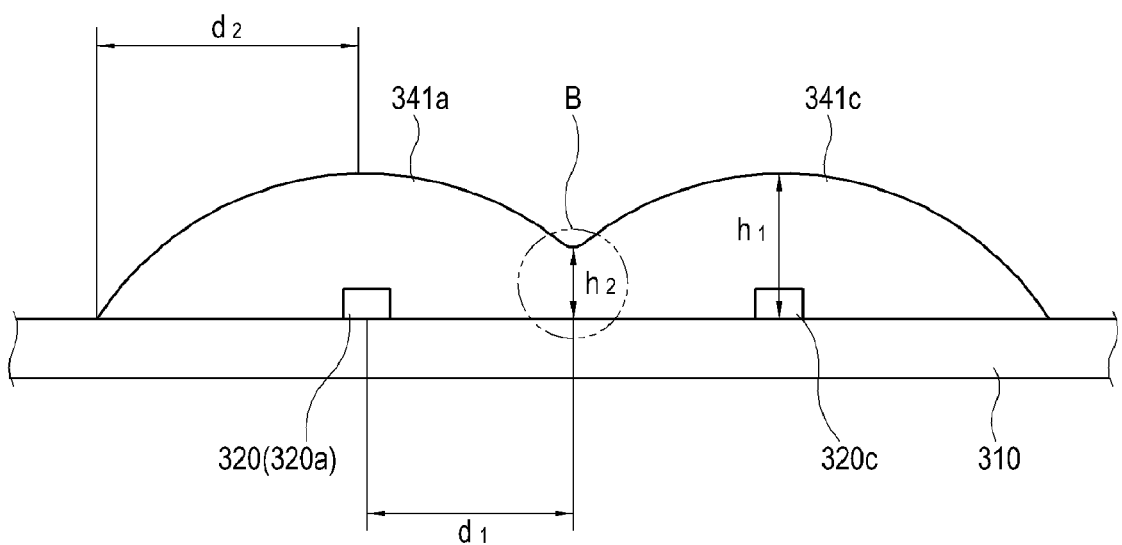
FIG. 5 is a cross-sectional view of the encapsulant of the LCD device taken along line □-□V-V in FIG. 2.

As shown in FIG. 3, FIG. 4, and FIG. 5, the encapsulants 340 include three lenses 341. The lenses 341 are connected to each other through an overlapping part B.

The lenses 341 have convex surfaces and the maximum height of each lens occurs at the center thereof. Except for the portions joining each other, each lens 341 has a circular shape. The centers of the respective lenses 341 correspond to the light emitting diode chips 320. That is, the lenses 341 include a first lens 341a corresponding to the first light emitting diode chip 320a emitting the red light, a second lens 341b corresponding to the second light emitting diode chip 320b emitting the green light, and a third lens 341c corresponding to the third light emitting diode chip 320c emitting the blue light.

The height of each lens is greatest between the substrates 310 and the center of the lens 341, as indicated by h1 of FIG. 5, and least between the overlapping part B and the substrates 310, as indicated by h2 of FIG. 5.

The lenses 341 partially overlap each other. Half of the distance between the light emitting diode chips 320, as indicated by d1 of FIG. 5, may be 70% to 95% of the radius d2 of the lens 341.

The employment of encapsulants 340 improves color mixing efficiency and light efficiency, which will be described with reference to a simulation result.

Figure 6A:
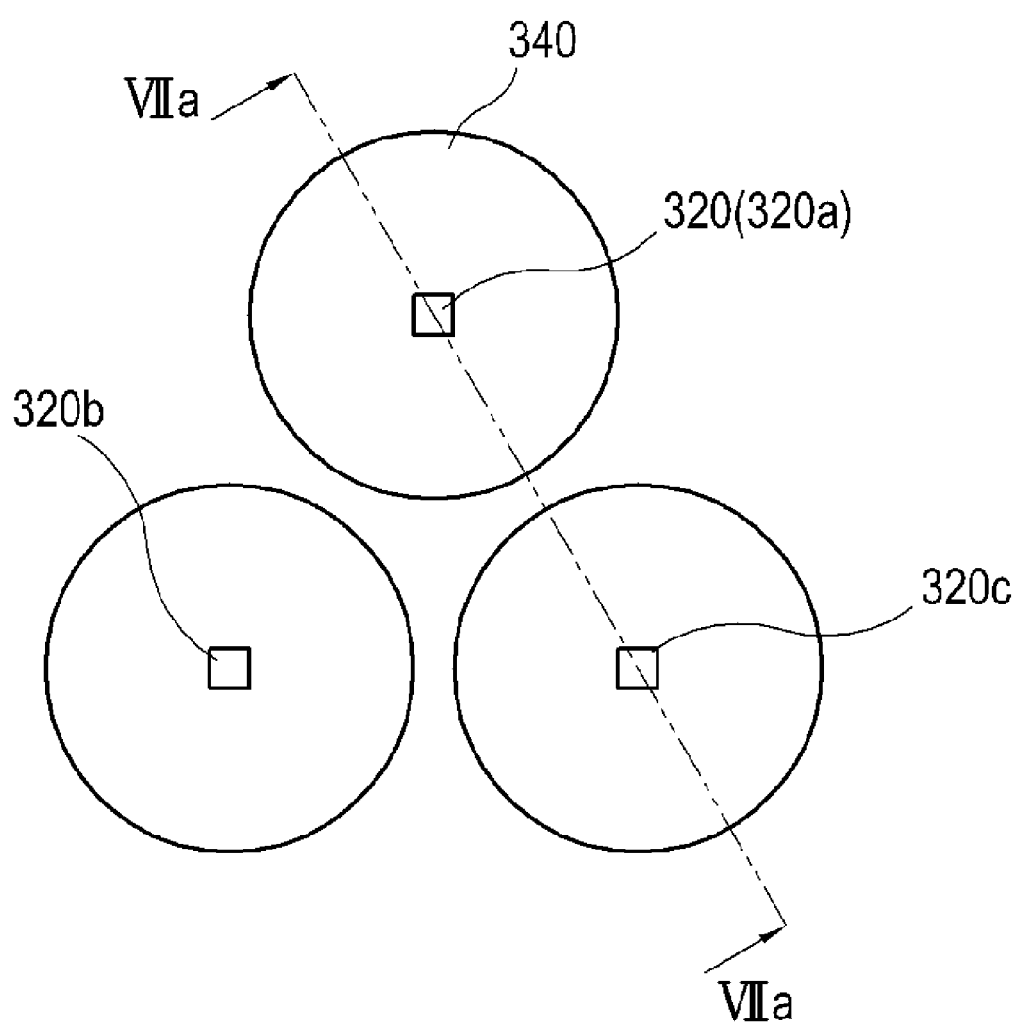
FIG. 6A, FIG. 6B, and FIG. 6C show simulation conditions.

The shape of the encapsulants 340 used in the simulation will be described with reference to FIG. 6A, FIG. 6B, FIG. 6C, FIG. 7A, FIG. 7B, and FIG. 7C. FIG. 6A and FIG. 7A show an example for a first comparative example, FIG. 6B and FIG. 7B show an example for a second comparative example, and FIG. 6C and FIG. 7C show an exemplary embodiment.

In both examples and the exemplary embodiment, there are three light emitting diode chips 320 arranged in a triangular shape. The light emitting diode chips 320 include the first light emitting diode chip 320a that emits a red light, the second light emitting diode chip 320b that emits a green light, and the third light emitting diode chip 320c that emits a blue light.

In the first comparative example, as shown in FIG. 6A and FIG. 7A, the encapsulants 340 corresponding to the respective light emitting diode chips 320 are spaced apart from each other. The respective encapsulants 340 are each shaped like a lens with the highest part of each encapsulant corresponding to the light emitting diode chips 320.

Figure 6B:
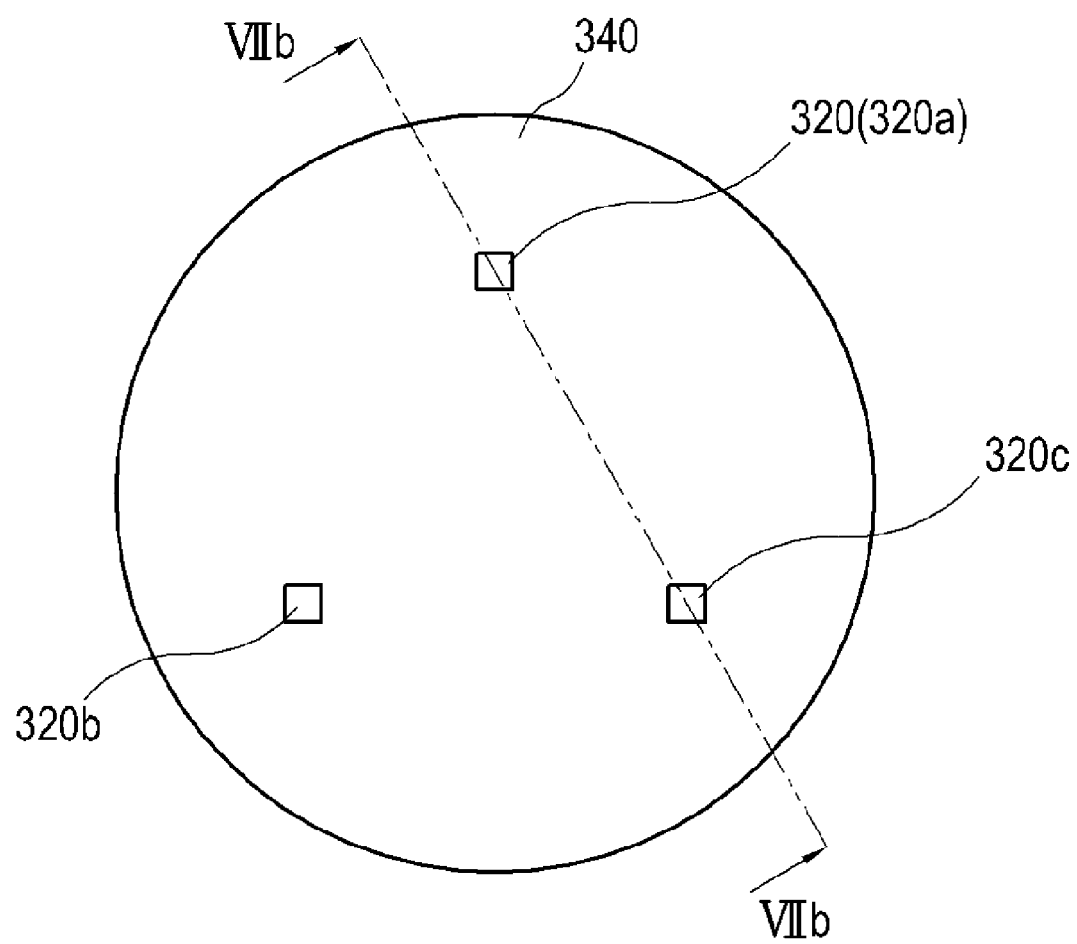
Figure 6C:
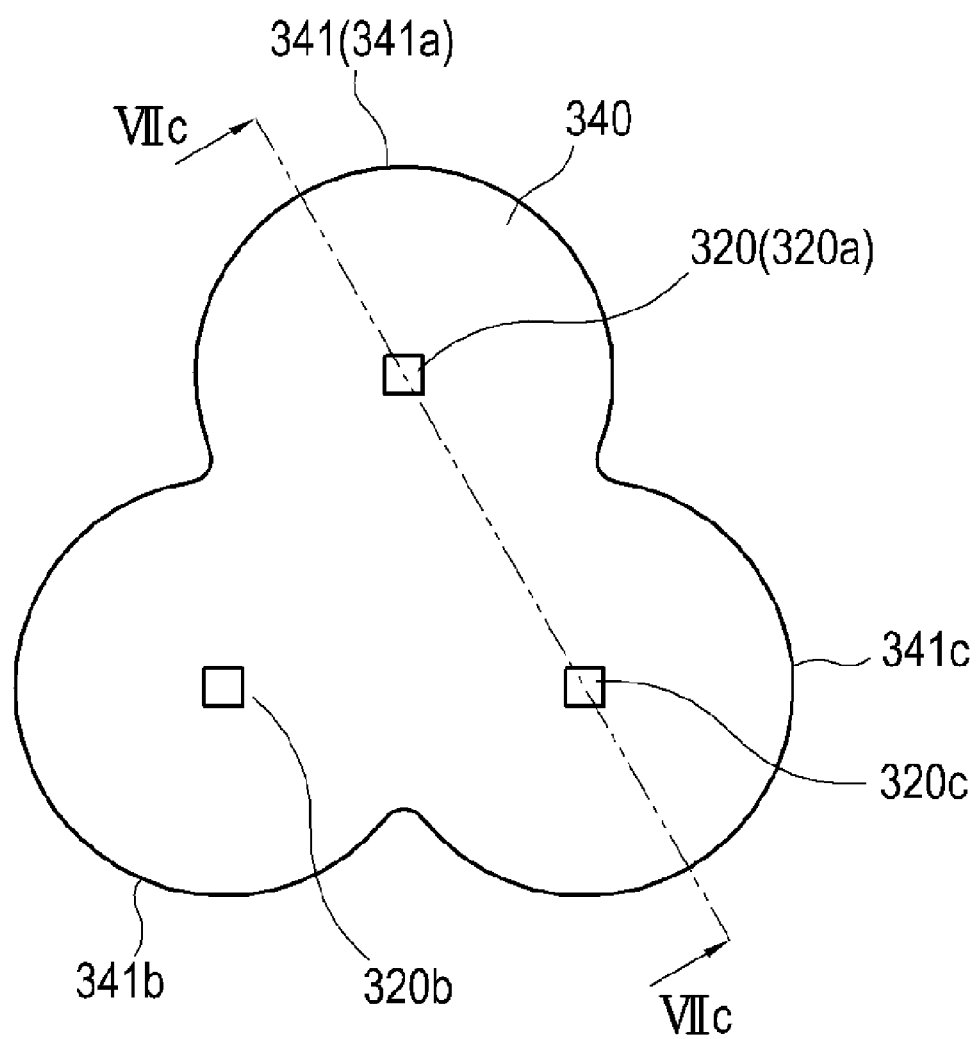
Figure 7A:
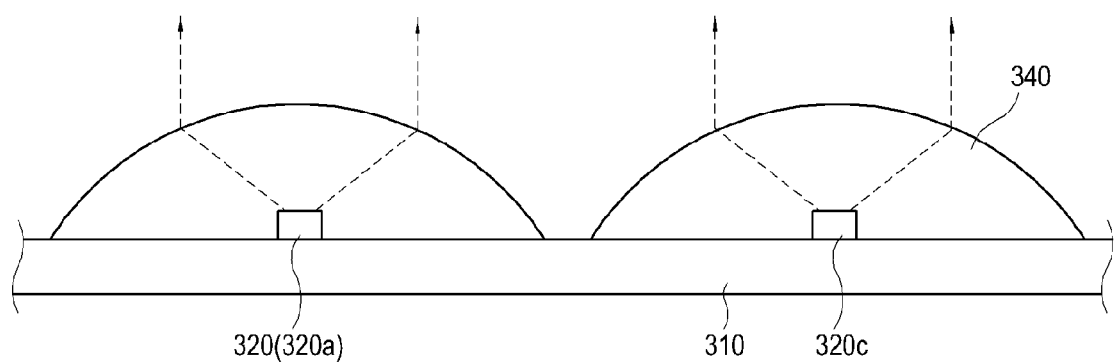
FIG. 7A, FIG. 7B, and FIG. 7C show simulation results.
Figure 7B:
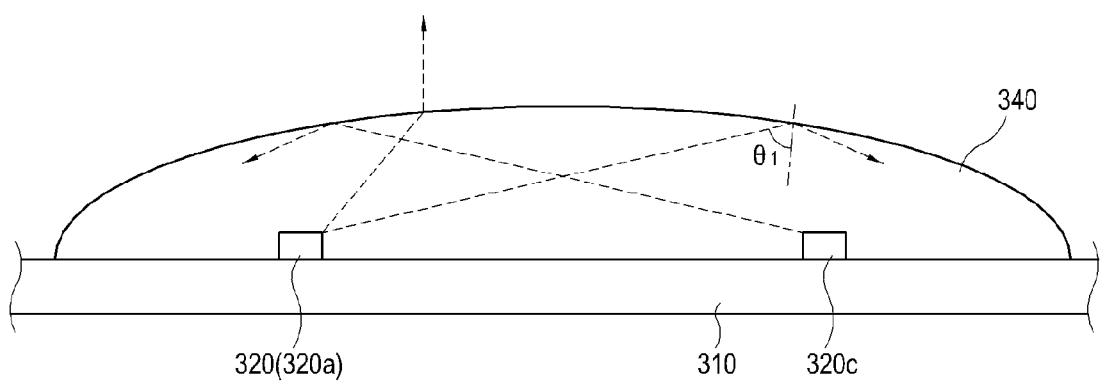
Figure 7C:
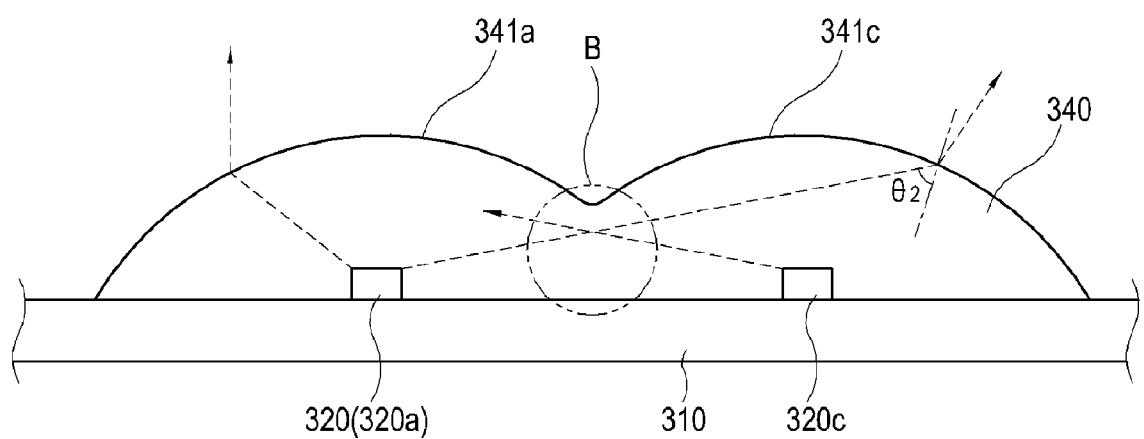

In the second comparative example, as shown in FIG. 6B and FIG. 7B, the encapsulants 340 are integrally provided and encapsulate the three light emitting diode chips 320. Unlike the exemplary embodiment, the encapsulants 340 form a single lens. Thus, the height of the encapsulants 340 is greatest at the center thereof, instead of at the top of each light emitting diode chips 320.

In the exemplary embodiment, as shown in FIG. 6C and FIG. 7C, the encapsulants 340 are integrally formed and encapsulate the three light emitting diode chips 320. Three lenses 341 are formed in the encapsulants 340 corresponding to the respective light emitting diode chips 320 and portions of each lens 341 overlap the other lenses.

The simulation is conducted with the two comparative examples and the exemplary embodiment to calculate light efficiency and a white light ratio. The light efficiency refers to the ratio of the amount of light reaching the liquid crystal display panel 10 to the total amount of light emitted from the light emitting diode chip 320.

TABLE 1

|  | Comparative Example 1 | Comparative Example 2 | Exemplary Embodiment |
|---|---|---|---|
| Light efficiency | 1.00 | 0.78 | 1.00 |
| White light ratio | 1.00 | 0.55 | 1.38 |

As shown in Table 1, the exemplary embodiment provides the same result as Comparative Example 1, with regard to light efficiency, and a higher result than Comparative Example 2. Also, the exemplary embodiment shows the best result in white light ratio.

The reason that the exemplary embodiment has higher light efficiency than Comparative Example 2 is as follows.

As shown in FIG. 7B, a considerable portion of the light from the light emitting diode chips 320 is incident to far surfaces of the encapsulants 340. That is, the light is incident to the surface of the encapsulants 340 on the different light emitting diode chips 320.

As the encapsulants 340 form a single lens, the surface thereof is a single dome so that the incident angle θ1 becomes large. As a result, total reflection occurs, thereby decreasing light efficiency.

In the exemplary embodiment shown in FIG. 7C, some of the light from the light emitting diode chips 320 is incident to the far surfaces of the encapsulants. That is, some of the light from the light emitting diode chip 320a corresponding to the first lens 341a is incident to the surface of the third lens 341c through the overlapping part B. In the exemplary embodiment, the lenses 341 are provided separately to correspond to the respective light emitting diode chips 320 resulting in a multi-dome surface. Thus, the incident angle θ2 becomes small, thereby preventing total reflection and increasing light efficiency.

The distance between the highest point of each encapsulant 340 and the center of the overlapping part B is limited by the viscosity of the encapsulants 340. The surface of the encapsulants 340 in the Comparative Example 2 may be altered to create a multi-dome surface, causing a rise in production costs.

The reason that the exemplary embodiment has higher color mixing results than the Comparative Example 1 is as follows.

As shown in FIG. 7A, light from the light emitting diode chips 320 is emitted to the outside before mixing.

As shown in FIG. 7C, a portion of the light from the light emitting diode chips 320 travels through the overlapping part B between the lenses 341 and is mixed with light of different color(s) from other light emitting diode chips 320. According to the exemplary embodiment, color may be mixed within the encapsulants 340, thereby improving white light efficiency.

A method of manufacturing the liquid crystal display device according to the first exemplary embodiment of the present invention will be described with reference to FIG. 8A, FIG. 8B, and FIG. 8C.

Figure 8A:
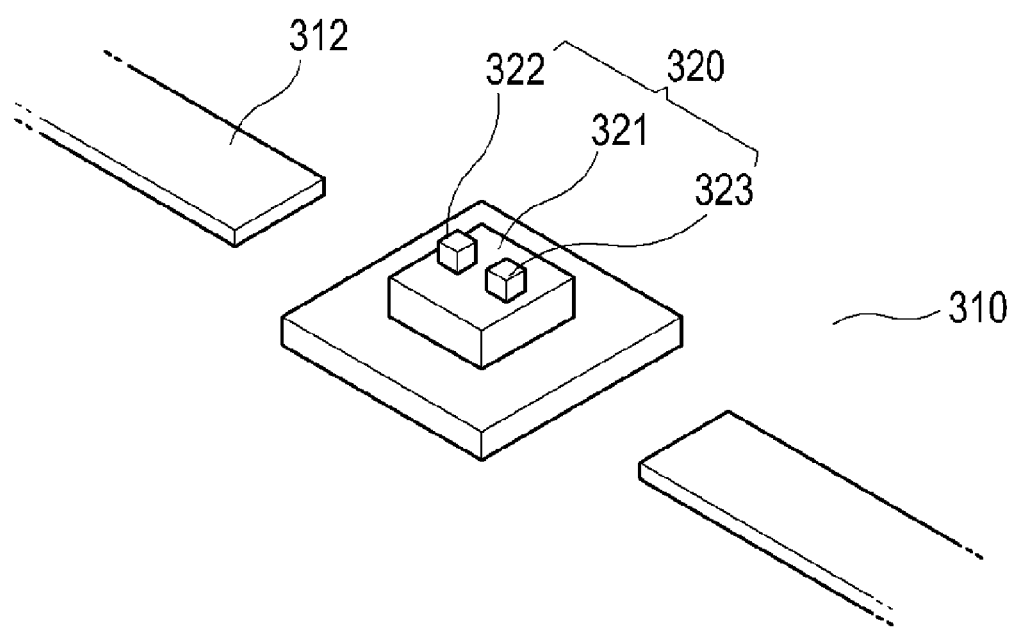
FIG. 8A, FIG. 8B, and FIG. 8C show a method of manufacturing the LCD device according to the first exemplary embodiment of the present invention.

As shown in FIG. 8A, the light emitting diode chips 320 are mounted on the substrates 310. The light emitting diode chips 320 may be mounted on the substrates 310 through soldering.

Figure 8B:
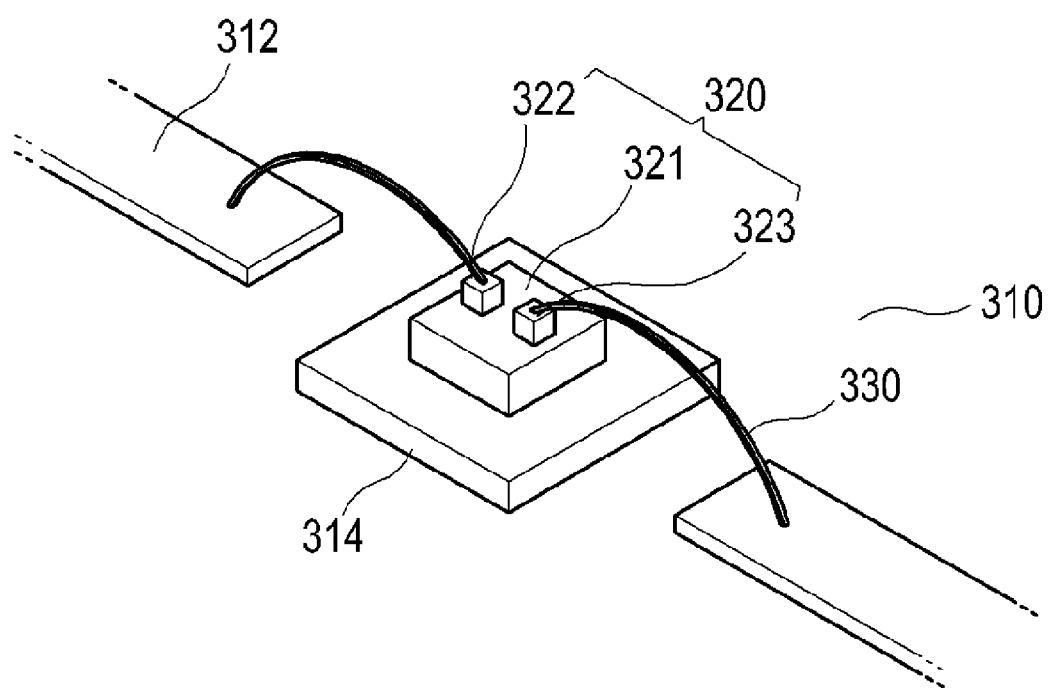

As shown in FIG. 8B, the light emitting diode chips 320 are connected to the power supply wires 312 through a wire bonding.

Figure 8C:
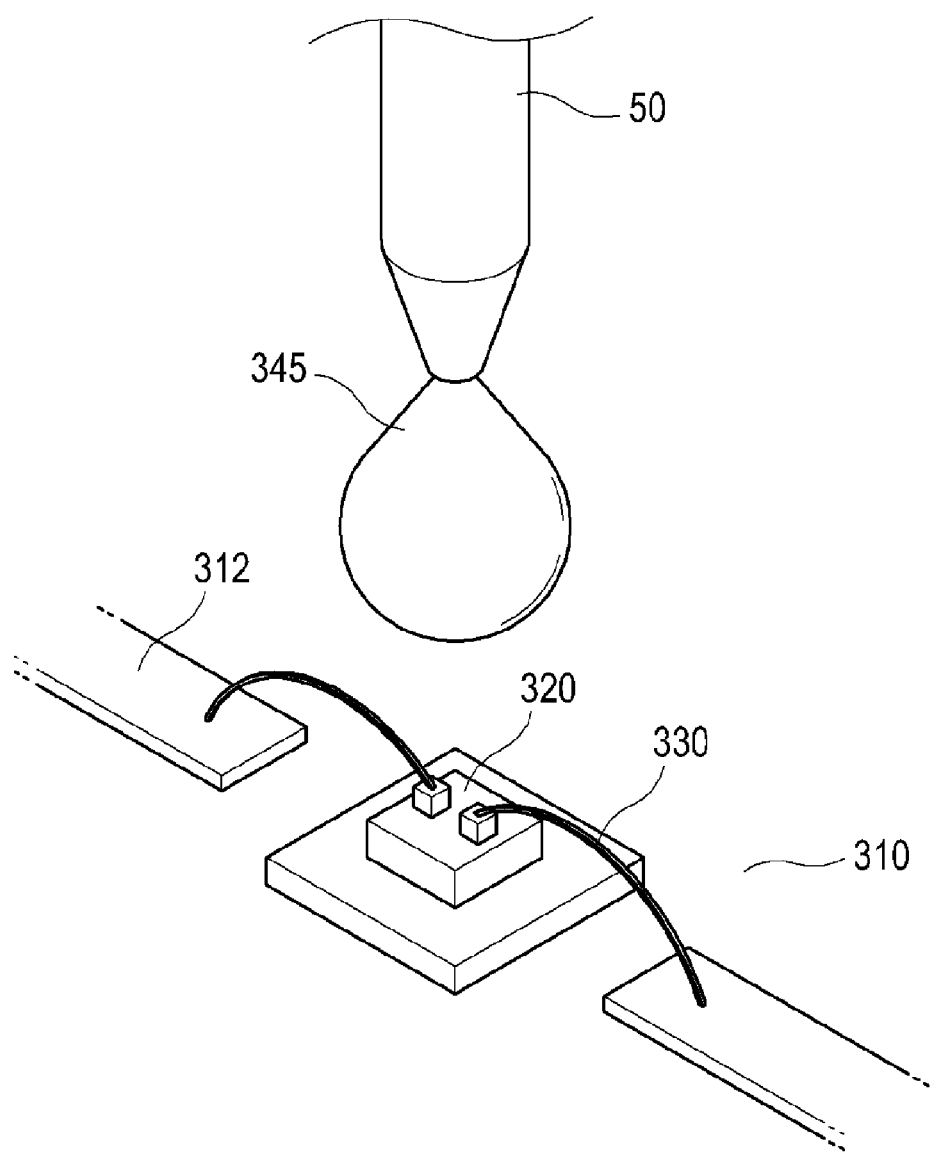

As shown in FIG. 8C, the light emitting diode chips 320 and the wire 330 are encapsulated to be protected and to adjust the emission angle of the light emitting diode chips 320. Here, a dispensing method, in which an encapsulating material 345 is dropped on the light emitting diode chips 320 through a syringe 50, is used to encapsulate the light emitting diode chips 320.

The encapsulating material 345 may be shaped like a lens due to the viscosity and surface tension thereof. The viscosity of the encapsulating material 345 may be varied by adjusting the quantity of a solute.

The encapsulating material 345 is dropped on neighboring light emitting diode chips 320. Here, all of the dropped encapsulating material 345 is connected. The encapsulating material 345 is then cured through heat and/or ultraviolet rays to complete the encapsulants 340. The interval between the light emitting diode chips 320 may be narrower to assemble the portions of encapsulating material 345 together.

In another exemplary embodiment, the lenses 341 may be respectively formed one after another by dropping and curing the encapsulating material 345.

In another exemplary embodiment, the encapsulating material 345 is dropped and partially cured to fix the shape of one lens 341 and then to fix that of another lens 341. Here, the encapsulants 340 are completed by curing the encapsulating material 345 after forming three lenses 341.

Another method of manufacturing a liquid crystal display device will be described with reference to FIG. 9A, FIG. 9B, and FIG. 9C.

Figure 9A:
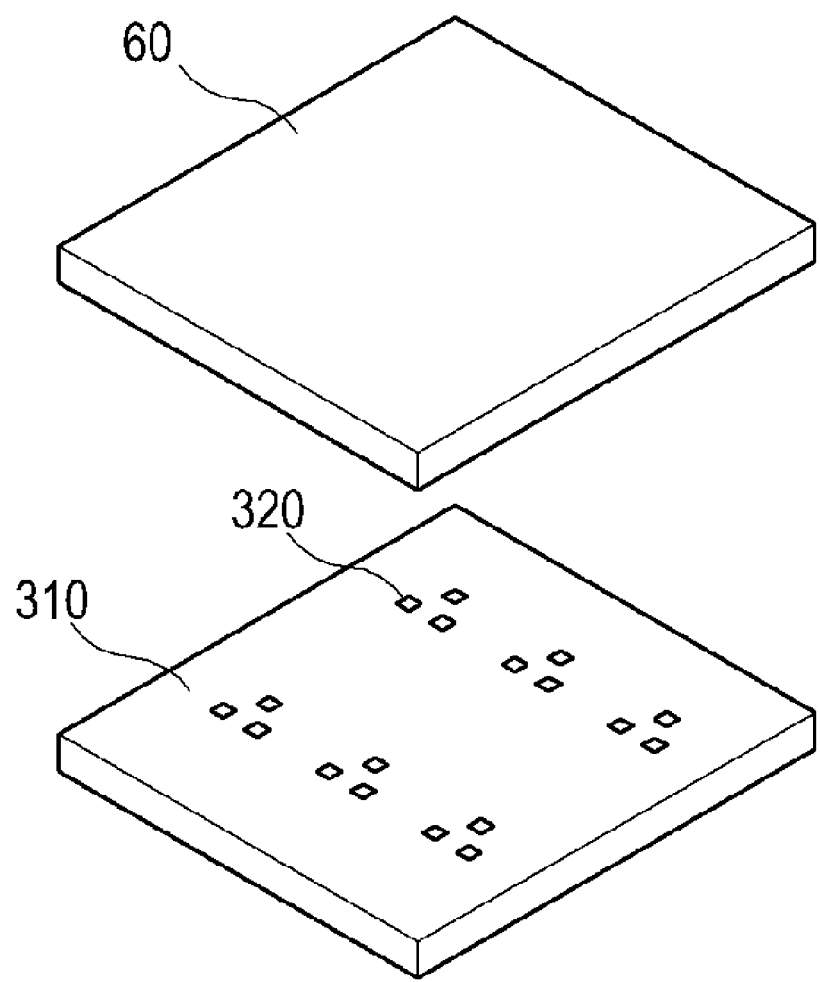
FIG. 9A, FIG. 9B, and FIG. 9C show another method of manufacturing the LCD device according to the first exemplary embodiment of the present invention.

As shown in FIG. 9A, the light emitting diode chips 320 are mounted on the substrates 310 and a transfer mold 60 is disposed thereon. The light emitting diode chips 320 are wire-bonded with the substrates 310.

Figure 9B:
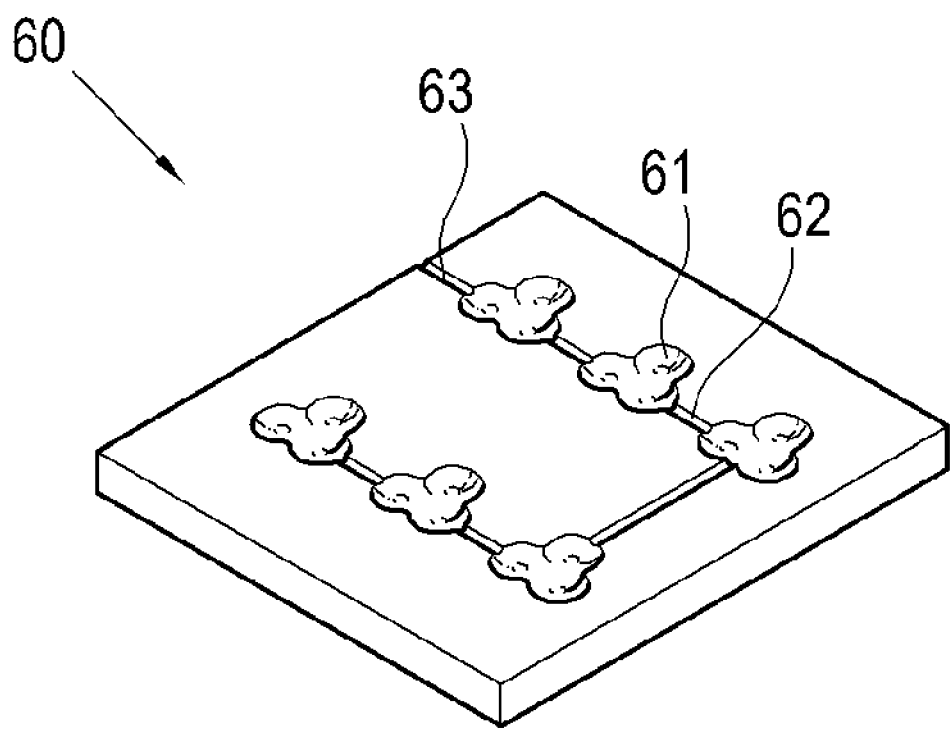

FIG. 9B shows a rear side of the transfer mold 60, i.e., a part that faces the substrates 310. An encapsulant forming pattern 61 is engraved on the rear side of the transfer mold 60 corresponding to the encapsulants 340 to be formed. The respective encapsulant forming patterns 61 communicate with each other through a connecting groove 62. One of the encapsulant forming patterns 61 is connected with a supply groove 63 that extends to a lateral side of the transfer mold 60.

Figure 9C:
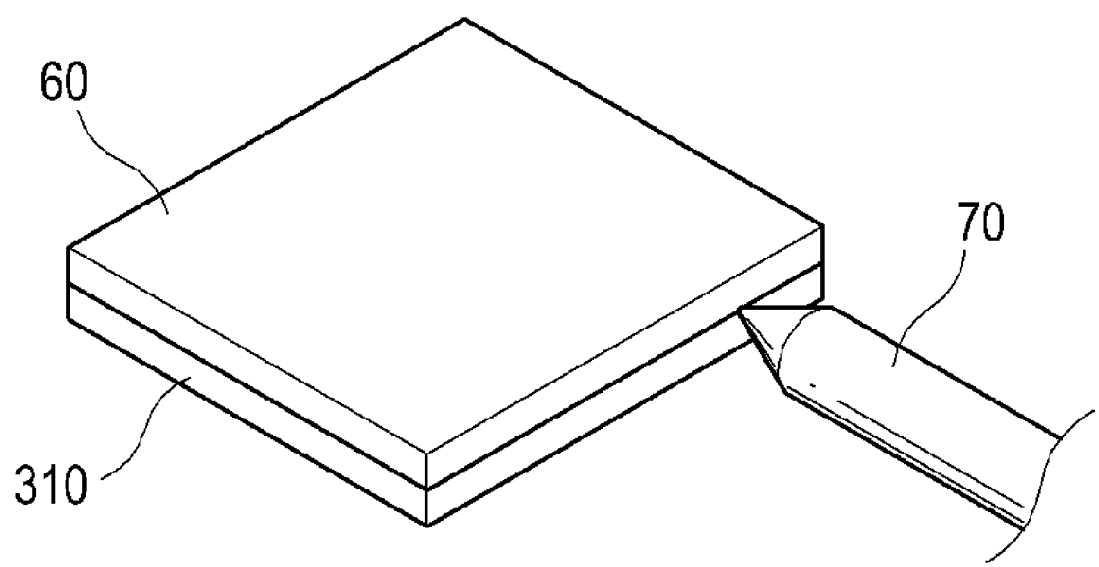

As shown in FIG. 9C, the substrates 310 and the transfer mold 60 are adhered to each other. An encapsulating material (not shown) is supplied to the supply groove 63 through a syringe 70. The encapsulating material may be liquid and may fill up the respective encapsulant forming patterns 61 while moving through the supply groove 63. If the encapsulant forming patterns 61 are filled with the encapsulating material, the encapsulating material may be cured by heat and/or ultraviolet rays to form an encapsulant 340.

Then, the transfer mold 60 is removed from the substrates 310. The encapsulating material along the supply groove 63 is cured too. Such an encapsulating material may be removed as necessary.

In another exemplary embodiment, a plurality of supply grooves 63 may be provided to reduce the time required to supply the encapsulating material. The transfer mold 60 may include a light transmissive material to cure the encapsulating material through ultraviolet rays.

Figure 10:
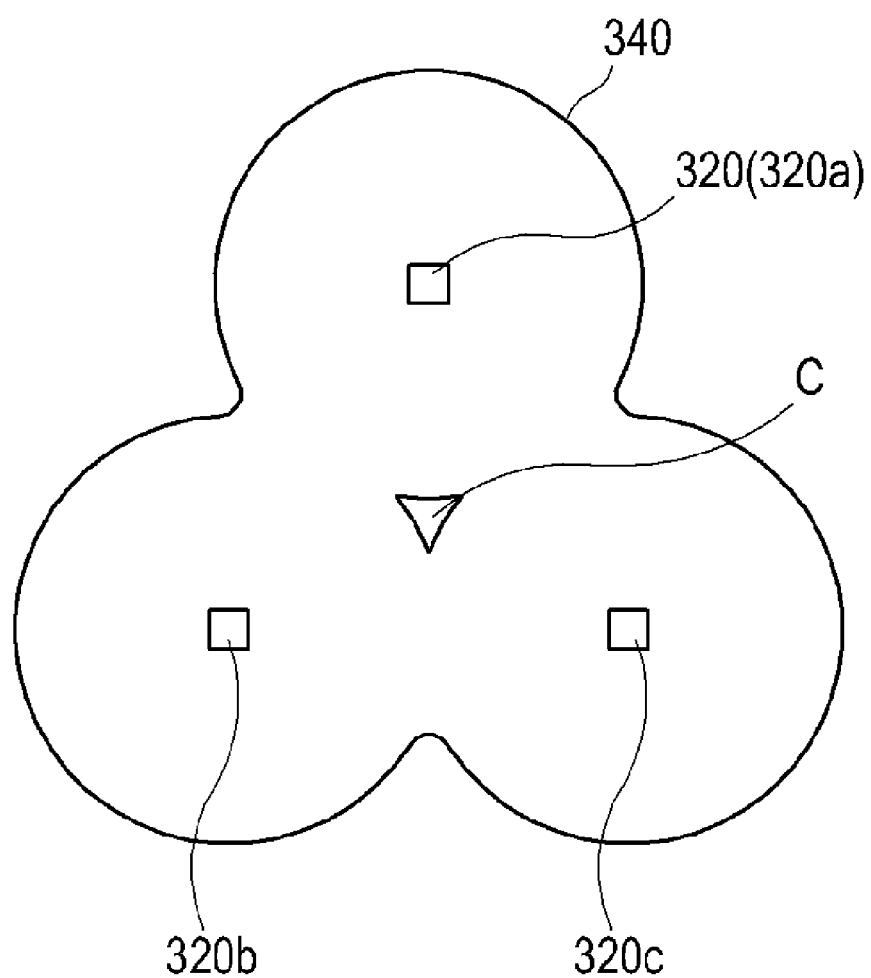
FIG. 10 shows an LCD device according to a second exemplary embodiment of the present invention.

A liquid crystal display device according to a second exemplary embodiment of the present invention will be described with reference to FIG. 10.

The center C of the encapsulant 340 does not contain encapsulating material. When lenses 341 are connected to each other, except for in a center part C, color mixing efficiency and light efficiency are as high as that in the first exemplary embodiment.

Figure 11:
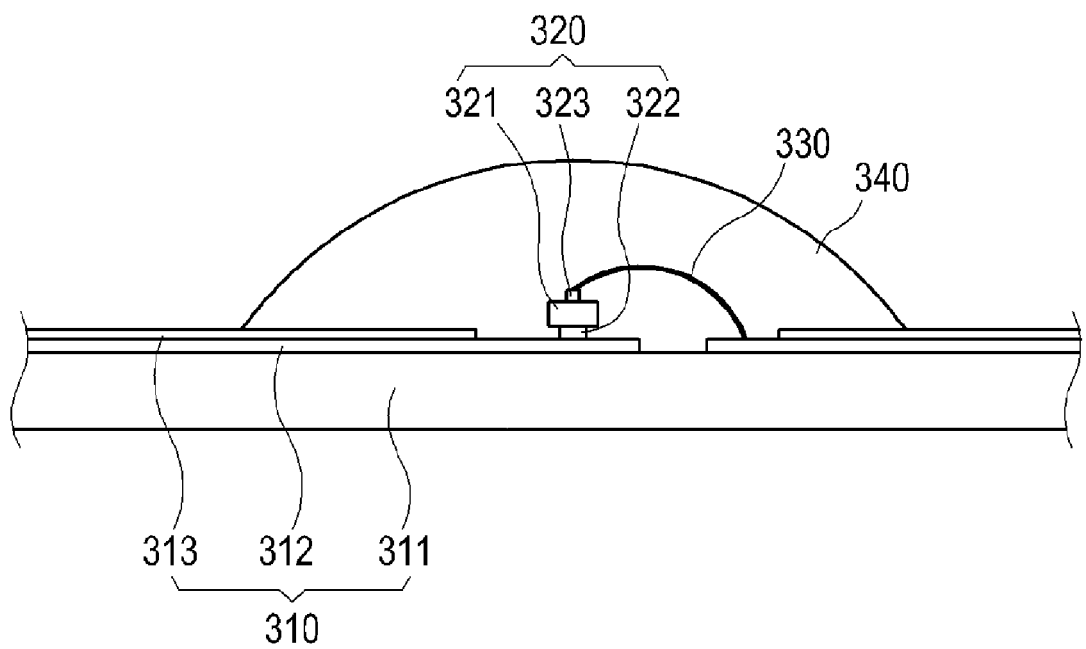
FIG. 11 shows an LCD device according to a third exemplary embodiment of the present invention.

A liquid crystal display device according to a third exemplary embodiment of the present invention will be described with reference to FIG. 11. FIG. 11 is a cross-sectional view of part "A" taken along line IV-IV in FIG. 2.

One of electrodes 322 and 323 is disposed on a chip main body 321 of a light emitting diode chip 320 while the other electrode 322 and 323 is disposed under the chip main body 321 thereof.

Figure 12:
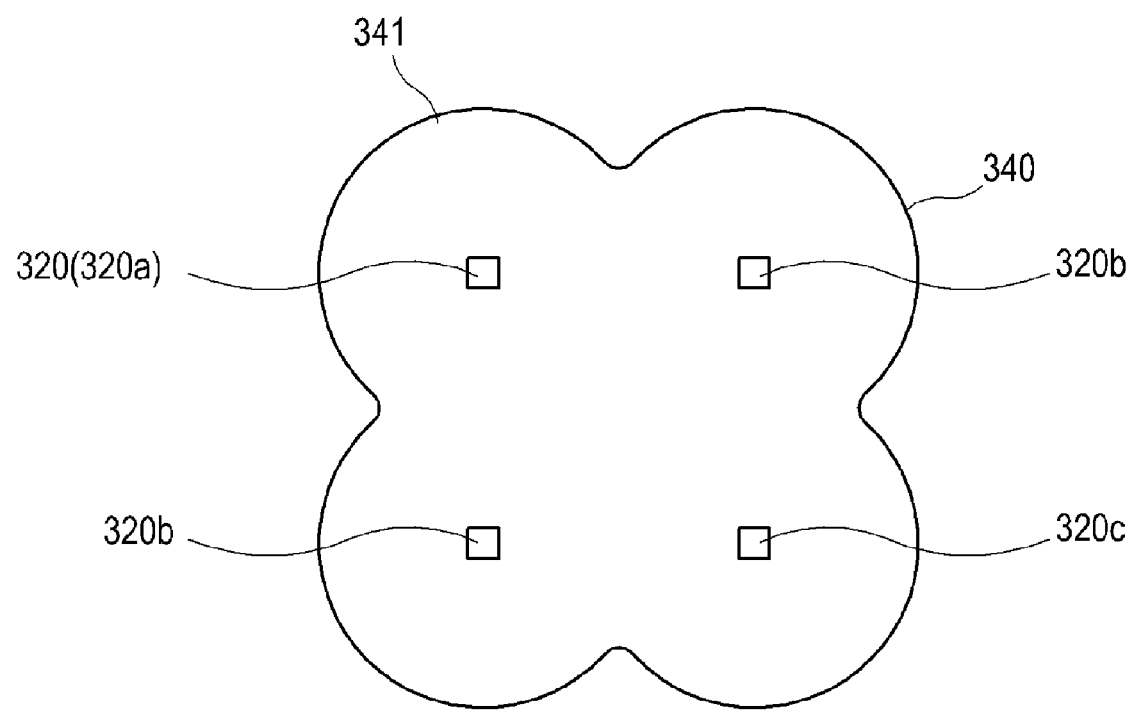
FIG. 12 shows an LCD device according to a fourth exemplary embodiment of the present invention.
Figure 13:
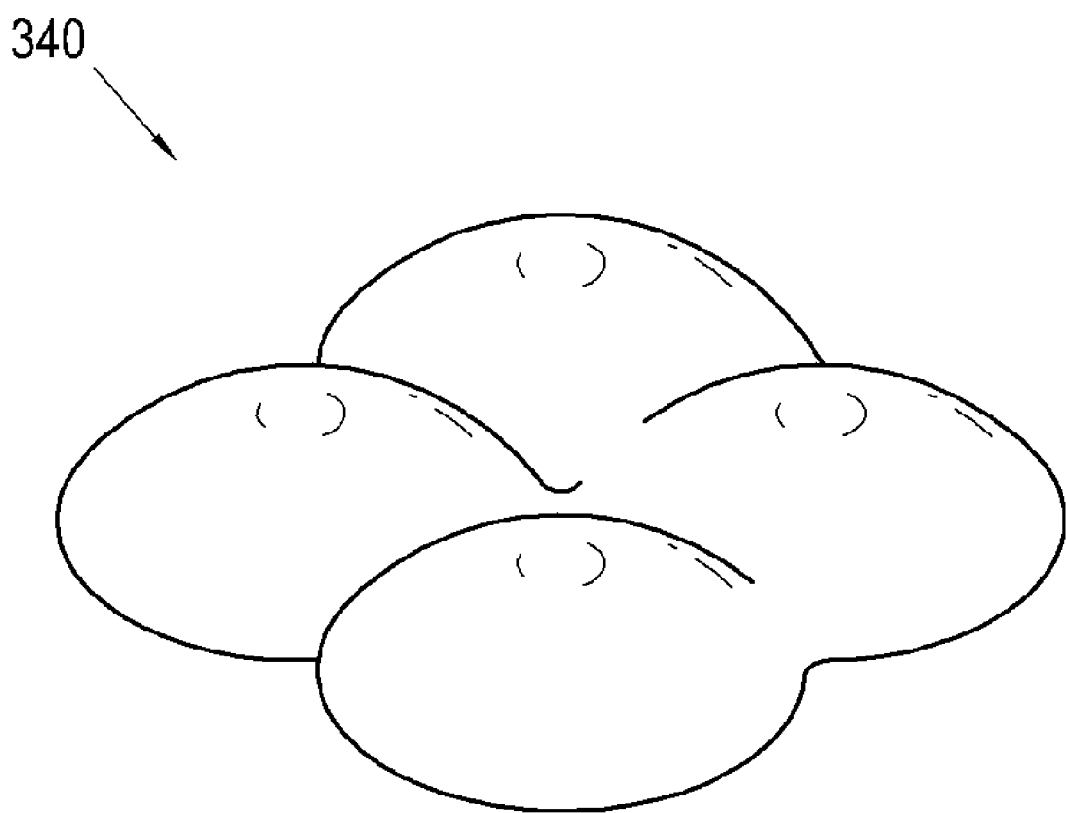
FIG. 13 is a perspective view of an encapsulant of the LCD device according to the fourth exemplary embodiment of the present invention.

A liquid crystal display device according to a fourth exemplary embodiment of the present invention will be described with reference to FIG. 12 and FIG. 13.

An encapsulant 340 encapsulates four light emitting diode chips 320. The four light emitting diode chips 320 are arranged in a square shape and include a red light emitting diode 320a, a pair of green light emitting diodes 320b, and a blue light emitting diode 320c.

The green light emitting diodes 320b are arranged diagonal to one another. The encapsulant 340 includes four lenses 341 corresponding to the respective light emitting diodes 320. The lenses 341 are connected to each other, thereby providing high color mixing efficiency and light efficiency.

In the foregoing exemplary embodiment, the light source device is disposed across the rear side of the liquid crystal display panel, but it is not limited thereto. Alternatively, a light guiding plate may be provided behind the liquid crystal display panel and the light source device may be provided in a lateral side of the light guiding plate.

As described above, the present invention provides a light source device which has high color mixing efficiency and light efficiency, as well as a liquid crystal display device including the light source device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light source device, comprising:
a substrate;
a plurality of light emitting diode chips mounted on the substrate; and
an encapsulant covering the plurality of light emitting diode chips and comprising a plurality of lenses in which each lens corresponds to one of the plurality of light emitting diode chips,
wherein each lens has a circular shape in a top view, and has a maximum height at a central portion corresponding to each of the light emitting diode chips,
wherein a distance between an overlapping part and the central portion of each lens is shorter than a radius of each lens, and
wherein a center of the encapsulant is disposed between the light emitting diode chips and does not overlap any of the light emitting diode chips.

2. The light source device of claim 1, wherein the encapsulant covers three light emitting diode chips, and each chip emits a light having a different color from the other chips.

3. The light source device of claim 2, wherein the three light emitting diode chips are arranged in a triangular shape.

4. The light source device of claim 1, wherein half of the distance between light emitting diode chips is 70% to 95% of a radius of each lens.

5. The light source device of claim 1, wherein the encapsulant covers four light emitting diode chips.

6. The light source device of claim 5, wherein the four light emitting diode chips are arranged in a square shape.

7. The light source device of claim 5, wherein two of the light emitting diode chips emit light of the same color.

8. The light source device of claim 1, wherein the encapsulant comprises at least one of silicon resin, epoxy resin, and acrylic resin.

9. A light source device, comprising:
a substrate;
a plurality of light emitting diode chips mounted on the substrate; and
an encapsulant covering the plurality of light emitting diode chips, the encapsulant comprising a plurality of lenses in which each lens corresponds to one of the light emitting diode chips, each lens having a circular shape in a top view and having a maximum height at a central portion corresponding to each of the light emitting diode chips, and a distance between an overlapping part and the central portion of each lens being shorter than a radius of each lens,
wherein the height of the encapsulant is greater in portions of each lens corresponding to the respective light emitting diode chips than in the center of the encapsulant.

10. The light source device of claim 9, wherein the encapsulant covers four light emitting diode chips and two of the light emitting diode chips emit light of the same color.

11. The light source device of claim 9, wherein the encapsulant covers three light emitting diode chips, and each chip emits a light having a different color from the other chips.

12. The light source device of claim 11, wherein half of the distance between any two light emitting diode chips is 70% to 95% of a radius of each lens.

13. A liquid crystal display device, comprising:
a liquid crystal display panel; and
a light source part disposed behind the liquid crystal display panel, the light source part comprising:
a substrate,
a plurality of light emitting diode chips mounted on the substrate, and an encapsulant covering the plurality of light emitting diode chips and comprising a plurality of lenses in which each lens corresponds to one of the plurality of light emitting diode chips, wherein each lens has a circular shape in a top view, and has a maximum height at a central portion corresponding to each of the light emitting diode chips, wherein a distance between an overlapping part and the central portion of each lens is shorter than a radius of each lens, and wherein a center of the encapsulant is disposed between the light emitting diode chips and does not overlap any of the light emitting diode chips.

14. The liquid crystal display device of claim 13, wherein the encapsulant comprises at least one of silicon resin, epoxy resin, and acrylic resin.

15. The liquid crystal display device of claim 13, wherein the encapsulant covers three light emitting diode chips, and each chip emits a light having a different color from the other chips.

16. The liquid crystal display device of claim 15, wherein the three light emitting diode chips are arranged in a triangular shape.

17. The liquid crystal display device of claim 13, wherein half of the distance between any two light emitting diode chips is 70% to 95% of a radius of each lens.

18. The liquid crystal display device of claim 13, wherein the encapsulant covers four light emitting diode chips.

19. The liquid crystal display device of claim 18, wherein the four light emitting diode chips are arranged in a square shape, and two of the four light emitting diode chips emit light of the same color.

* * * * *